(12) United States Patent
Adar

(10) Patent No.: US 7,385,447 B1
(45) Date of Patent: Jun. 10, 2008

(54) POWER AMPLIFIER HAVING CURVE-FITTING PREDISTORTER

(75) Inventor: Aharon Adar, Berkeley Height, NJ (US)

(73) Assignee: Anadigics, Inc., Warren, NJ (US)

( * ) Notice: Subject to any disclaimer, the term of this patent is extended or adjusted under 35 U.S.C. 154(b) by 257 days.

(21) Appl. No.: 10/879,940

(22) Filed: Jun. 28, 2004

(51) Int. Cl.
*H03F 1/26* (2006.01)

(52) U.S. Cl. ...................................... 330/149
(58) Field of Classification Search ............ None
See application file for complete search history.

(56) References Cited

U.S. PATENT DOCUMENTS

| | | | | |
|---|---|---|---|---|
| 5,172,068 | A | | 12/1992 | Childs ........................ 327/100 |
| 5,523,716 | A | * | 6/1996 | Grebliunas et al. .......... 330/149 |
| 5,524,286 | A | | 6/1996 | Chiesa et al. ................ 455/126 |
| 5,589,797 | A | | 12/1996 | Gans et al. .................. 330/149 |
| 5,748,678 | A | | 5/1998 | Valentine et al. ........... 375/297 |
| 5,929,703 | A | | 7/1999 | Sehier et al. ................ 330/149 |
| 6,075,411 | A | | 6/2000 | Briffa et al. ................. 330/149 |
| 6,107,877 | A | | 8/2000 | Miguelez et al. ............. 330/66 |
| 6,127,889 | A | * | 10/2000 | Myer ........................ 330/149 |
| 6,255,908 | B1 | * | 7/2001 | Ghannouchi et al. ....... 330/149 |
| 6,329,875 | B1 | * | 12/2001 | Ishida et al. .................. 330/51 |
| 2004/0070449 | A1 | * | 4/2004 | Pekonen et al. ............. 330/149 |

OTHER PUBLICATIONS

Christopher B. Haskins, "Diode Predistortion Linearization for Power Amplifier RFICs in Digital Radios," thesis for Master of Science in Electrical Engineering, Virginia Polytechnic Institute and State University, Apr. 17, 2000.

* cited by examiner

*Primary Examiner*—Robert J. Pascal
*Assistant Examiner*—Alan Wong
(74) *Attorney, Agent, or Firm*—Morgan, Lewis & Bockius LLP

(57) ABSTRACT

A power amplifier has a plurality of amplifier stages. One or more predistorters are each placed between amplifier stages within the power amplifier path. The predistorters set breakpoints in a predistortion curve and divide the predistortion curve into a plurality of segments. Each predistorter may be adjusted to change the slope of each segment. This adjustment forms a piecewise curve-fit to approximate the inverse of the amplifier transfer characteristic. The curve-fit can be made arbitrarily close to the amplifier transfer characteristic by the selection of a sufficient number of breakpoints and therefore a sufficient number of predistortion curve segments, leading to a satisfactory linearization of the power amplifier.

16 Claims, 8 Drawing Sheets

300

POWER AMPLIFIER HAVING CURVE-FITTING PREDISTORTER

BACKGROUND OF THE INVENTION

1. Field of the Invention

The present invention relates to power amplifiers. More specifically, the present invention relates to power amplifiers with predistorters.

2. Description of the Related Art

The operating range of an amplifier is characterized by a linear region where the gain, the ratio of the output power to the input power, is substantially constant and a nonlinear region where the gain varies. In the nonlinear region, the gain usually decreases as input power increases and is usually referred to as the compression region. If the input signal is confined to the linear region of the amplifier, the output signal is amplified without appreciable distortion. Conversely, if the input signal spills into the nonlinear region, the output signal will be distorted. The distortion caused by the amplifier depends on the characteristics of the particular amplifier and may be taken into account when designing amplifiers.

In a predistortion system, the amplitude and phase of the signal to be amplified is distorted before amplification such that the output amplified signal is characterized by a substantially constant gain over the range of the input signal. Such a system improves the operating characteristics of the amplifier by compensating and canceling the distortion signal at the input of the amplifier.

The concept of predistortion is well known in the art and is illustratively shown in FIGS. 1 and 2. In FIG. 1, the amplifier gain function 110 is substantially constant below input level, L1, and represents the linear operating range of the amplifier. Above input level, L1, the gain begins to decrease or compress. This compression region corresponds to the nonlinear operating range of the amplifier. In a predistortion system, the input signal is modified by a predistortion function 120, which compensates for the decreasing gain of the amplifier in the nonlinear range such that the total gain function 130 is substantially constant over the linear and nonlinear range of the amplifier.

In FIG. 2, the amplifier phase function 210 is substantially constant below input level, L2, and represents the linear operating range of the amplifier. Above input level L2, the phase of the signal is shifted by a different amount than the shift in the linear range and corresponds to the nonlinear operating range of the amplifier. In a predistortion system, the phase of the input signal is modified by a phase distortion function 220. The phase distortion function 220 compensates for the phase shift difference between the linear and nonlinear ranges of the amplifier such that the total phase function 130 is substantially constant over the linear and nonlinear range of the amplifier.

U.S. Pat. No. 5,172,068, entitled "Third-order Predistortion Circuit", presents a predistorter for mitigating third-order nonlinearities. The circuit includes first and second branches of series-connected diodes, with the diodes in the first branch being connected in reverse order relative to the diodes in the second branch, resulting in a push-pull arrangement. The diodes may be either pn-junction or Schottky barrier diodes, both of which have exponential transfer functions.

U.S. Pat. No. 5,524,286, entitled "Baseband Predistortion System for the Adaptive Linearization of Power Amplifiers", discloses a predistortion system based upon the updating of two error tables, one for amplitude and one for phase. The tables' contents are used to correct the baseband samples. The content of the tables is obtained by accumulating the difference, suitably weighted, between the sample entering the predistortion device and the demodulated feedback value.

U.S. Pat. No. 5,589,797, entitled "Low Distortion Amplifier" discloses a low distortion amplifier circuit. The circuit employs a cuber circuit in the predistortion path. The cuber circuit comprises a pair of antiparallel diodes.

U.S. Pat. No. 5,748,678, entitled "Radio Communication Apparatus", discloses a system in which digital processing in the baseband processor 30 applies a curve-fit routine to the predistortion circuit 28 to predistort the baseband signals.

U.S. Pat. No. 5,929,703, entitled "Method and Device for Modeling AM-AM and AM-PM Characteristics of an Amplifier, And Corresponding Predistortion Method", develops two series of polynomials respectively representative of the AM-AM and the AM-PM characteristics. The determination of each polynomial allows for the second derivative of the polynomial and for the distances between the samples and points on the curve defined by the polynomial.

U.S. Pat. No. 6,075,411, entitled "Method and Apparatus For Wideband Predistortion Linearization", discloses the creation of a predistortion signal which is a low order polynomial having adjustable coefficients. The predistortion signal compensates for third order and higher order intermodulation distortion over a wideband, on a coefficient-by coefficient basis.

U.S. Pat. No. 6,107,877, entitled "Method Predistortion Generator Coupled With An RF Amplifier", depicts Schottky diodes in an antiparallel configuration in a predistorter. The layout of the predistortion circuitry is specifically designed to enhance the performance of the circuitry without inducing any negative operating characteristics on the associated RF amplifier.

The contents of the aforementioned U.S. Pat. No. 5,172,068, U.S. Pat. No. 5,524,286, U.S. Pat. No. 5,589,797, U.S. Pat. No. 5,748,678, U.S. Pat. No. 5,929,703, U.S. Pat. No. 6,075,411, and U.S. Pat. No. 6,107,877 are incorporated by reference to the extent necessary to understand the present invention.

SUMMARY OF THE INVENTION

The present invention is directed to a power amplifier that comprises a first amplifier stage receiving a first input signal and producing a first output signal in response to the first input signal; a predistorter receiving the first output signal and producing a predistorted signal in response to the first output signal; a second amplifier stage receiving the predistorted signal and producing a second output signal in response to the predistorted signal; a first interstage matching network configured to match the output impedance of the first amplifier stage with the input impedance of the predistorter; and a second interstage matching network configured to match the output impedance of the predistorter with the input impedance of the second amplifier stage.

The power amplifier may further comprise a third amplifier stage receiving as input a signal to be amplified and producing the first input signal; and a third interstage matching network configured to match the output impedance of the third amplifier stage with the input impedance of the first amplifier stage.

The predistorter of the power amplifier may comprise Schottky diodes arranged in a shunt configuration. The arrangement may comprise a first diode with its anode connected to a first node and its cathode connected to a common node; a first capacitor connected between the first node and the common node and placed in parallel with the first diode; a first resistor connected between the first node and a first power supply; a second diode with its anode connected to a second node and its cathode connected to the common node; a second capacitor connected between the second node and the common node and placed in parallel with the second diode; a second resistor connected between the second node and a second power supply; and a third resistor in series with a third capacitor connected between the first node and the second node.

The present invention is also directed to a power amplifier that comprises at least first, second, and third amplifier stages; a first predistorter circuit between the first and second amplifier stages, and a second predistorter circuit between the second and third amplifier stages.

In this power amplifier, the first predistorter circuit may further comprise a first resistor in series with a first subcircuit, the first subcircuit comprising a first pair of antiparallel diodes connected in parallel with a second resistor; and the second predistorter circuit may further comprise a third resistor in series with a second subcircuit, the second subcircuit comprising a second pair of antiparallel diodes connected in parallel with a fourth resistor.

This power amplifier may further comprise a fourth amplifier stage and a third predistorter circuit between the third and fourth amplifier stages. The third predistorter circuit may further comprise a fifth resistor in series with a third subcircuit, the third subcircuit comprising a third pair of antiparallel diodes connected in parallel with a sixth resistor.

The present invention is also directed to a device, such as a wireless communication device, for example, a cellular telephone. The device has a power amplifier that comprises a first amplifier stage receiving a first input signal and producing a first output signal in response to the first input signal; a predistorter receiving the first output signal and producing a predistorted signal in response to the first output signal; a second amplifier stage receiving the predistorted signal and producing a second output signal in response to the predistorted signal; a first interstage matching network configured to match the output impedance of the first amplifier stage with the input impedance of the predistorter; and a second interstage matching network configured to match the output impedance of the predistorter with the input impedance of the second amplifier stage.

The device may have a power amplifier that comprises at least first, second, and third amplifier stages; a first predistorter circuit between the first and second amplifier stages, and a second predistorter circuit between the second and third amplifier stages.

BRIEF DESCRIPTION OF THE DRAWINGS

The invention will be described by reference to the preferred and alternative embodiments thereof in conjunction with the drawings in which.

DETAILED DESCRIPTION

Figure 1:
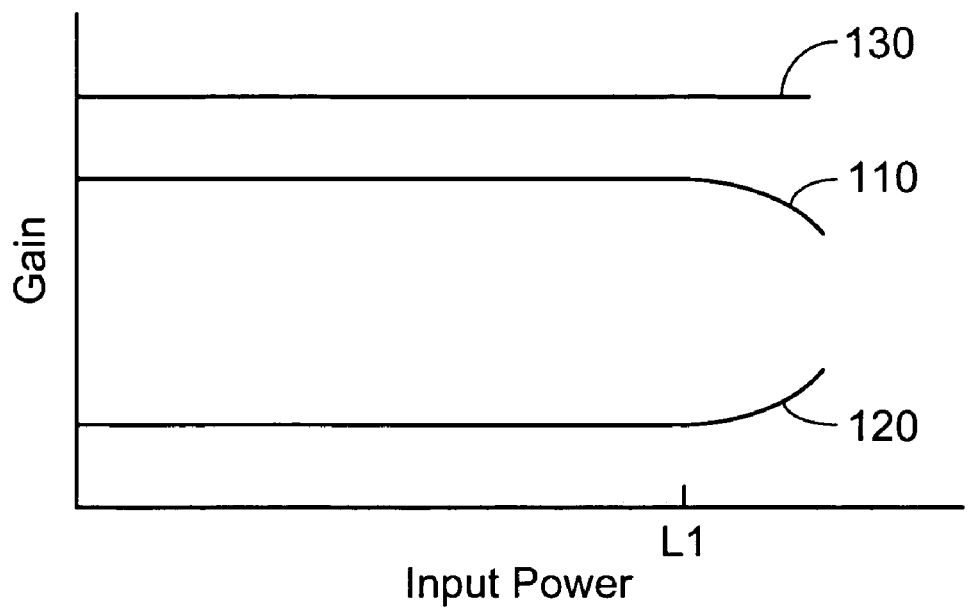
FIG. 1 illustrates the concept of predistorting the gain function of an amplifier.
Figure 2:
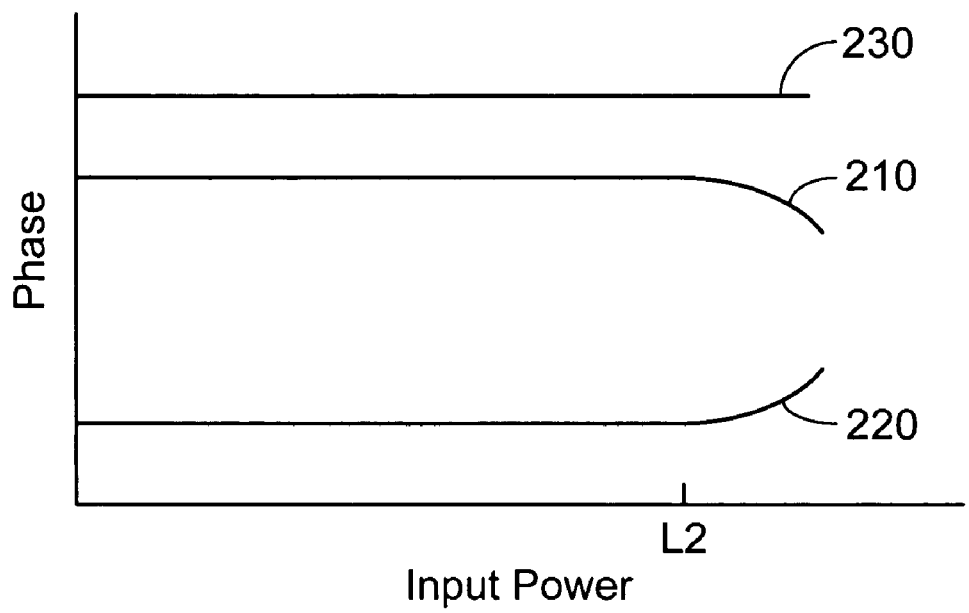
FIG. 2 illustrates the concept of predistorting the phase function of an amplifier.
Figure 3:
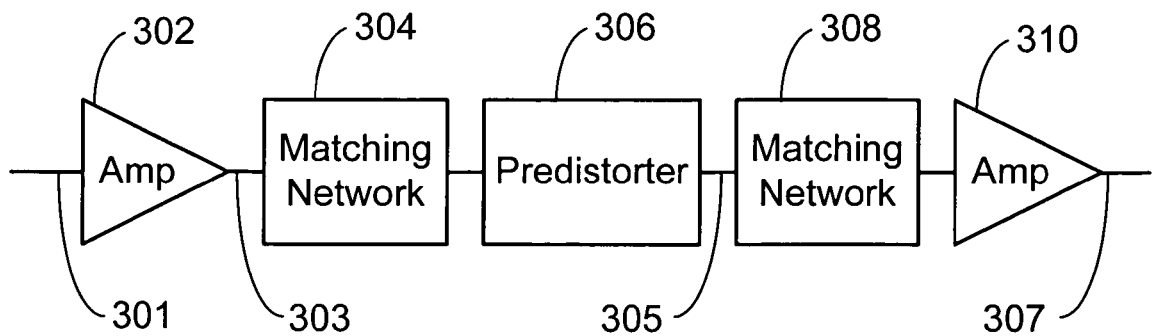
FIG. 3 shows a schematic of a power amplifier in a preferred embodiment according to the present invention.

FIG. 3 shows a schematic of a power amplifier in a preferred embodiment of the present invention. In FIG. 3, power amplifier 300 comprises a first amplifier, or driver, stage 302, a first interstage matching network 304, a predistorter 306, a second interstage matching network 308, and a second amplifier, or output, stage 310. First amplifier stage 302 receives an input signal 301 and, in response to the input signal, produces a first output signal 303. Predistorter 306 receives the first output signal 303 and, in response, produces a predistorted signal 305. Second amplifier stage 310 receives the predistorted signal 305 and, in response, produces a second output signal 307. First interstage matching network 304 is configured to match the output impedance of first amplifier stage 302 with the input impedance of predistorter 306, while second interstage matching network 308 is configured to match the output impedance of predistorter 306 with the input impedance of second amplifier stage 310.

Predistorter 306 distorts the first output signal 303 to compensate for the nonlinear behavior of the output stage 307 such that the second output signal 307 of the power amplifier 300 is a substantially undistorted amplification of the input signal 301. By incorporating predistorter 306 into the power amplifier 300 between the internal amplification stages, the loss caused by the impedance mismatch between the predistorter and the amplifier stage is reduced relative to placing the predistorter at the input of the power amplifier. This reduces the complexity of the design relative to prior art designs where an amplifier with higher gain is selected to compensate for the attenuation caused by the predistorter placed at the input of the amplifier.

Figure 4:
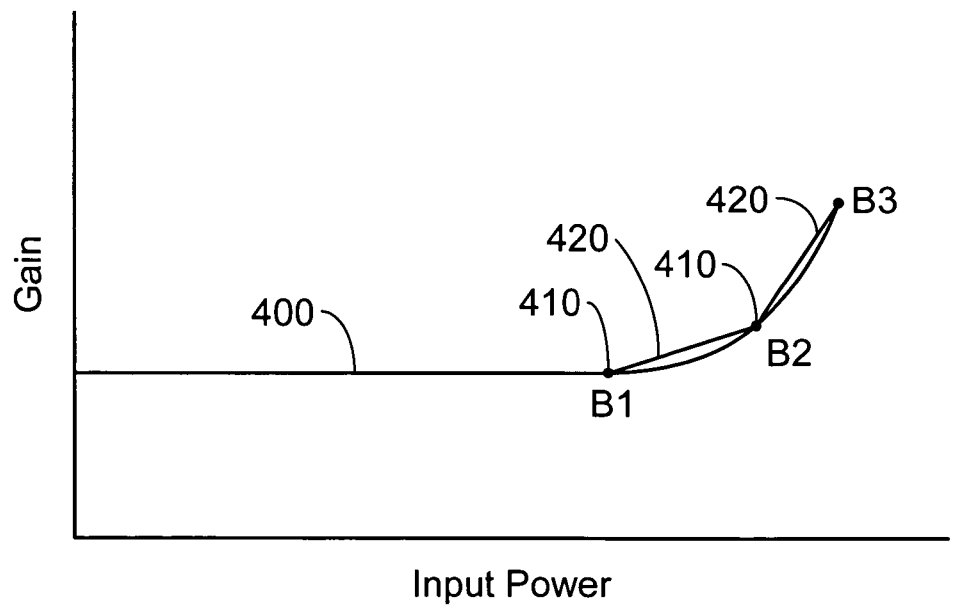
FIG. 4 is a schematic showing the concept of curve fitting.

FIG. 4 illustrates the piecewise curve-fit method applied to the predistortion gain function. FIG. 4 illustrates the use of two breakpoints 410, labeled B1 and B2, to approximate the predistortion function 400 with piecewise linear segments 420. The predistortion function 400 is based on the known characteristics of the output stage amplifier and is adjusted to compensate for the distortion caused by the output stage's nonlinear characteristics at high input power. The predistortion function 400 is approximated by a plurality of piecewise linear segments 420 as shown in FIG. 4. Each segment 420 is associated with a breakpoint 410 that is determined by the design of the predistorter 306. The fit of the approximation may be made arbitrarily close to the predistortion function by increasing the number of breakpoints in the predistorter.

Figure 5:
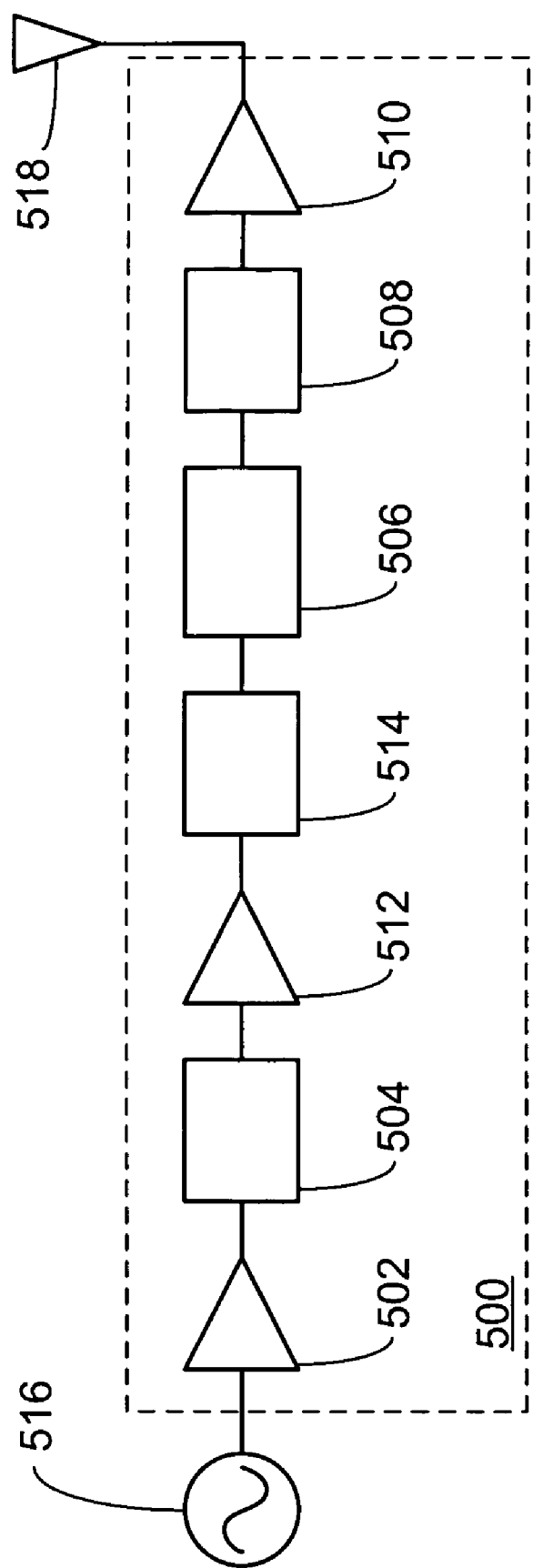
FIG. 5 shows a three-stage power amplifier in a preferred embodiment according to the present invention.

Although FIG. 3 illustrates a two-stage power amplifier, it should be understood that the present invention is not limited to two-stage amplifiers but encompasses all multi-stage amplifier designs. For example, FIG. 5 shows an embodiment of a three-stage power amplifier according to the present invention. As shown in FIG. 5, power amplifier 500 comprises a first, or input, amplifier stage 502, a first interstage matching network 504, a predistorter 506, a third interstage matching network 508, and a third amplifier, or output, stage 510. This portion of the amplifier 500 is similar to the power amplifier 300 shown in FIG. 3 which comprises the first, or input, amplifier stage 302, the first interstage matching network 304, the predistorter 306, the second interstage matching network 308, and the second, or output, amplifier stage 310. However, as shown in FIG. 5, power amplifier 500 further comprises a second amplifier stage 512 and a second interstage matching network 514. The first amplifier stage 502 receives as input a signal to be amplified by power amplifier 500 and, in response, produces the input signal for the second amplifier stage 512. The first interstage matching network 504 is configured to match the output impedance of the first amplifier stage 502 with the input impedance of the second amplifier stage 512.

Power amplifier 500 is preferably used in a wireless or wired communication device, such as a cellular telephone. In such case, the preferred carrier frequency in such a wireless device is between 900 MHz and 2 GHz, so that the device can accommodate GSM, DCS and other well-known wireless standards. It should be understood that other carrier frequencies may also, or instead, be accommodated. Power amplifier 500 may also be used in other handheld communication devices such as personal digital assistants for example.

When used in a communication device, such as a cellular telephone or wireless-enabled handheld computing platform, power amplifier 500 may be placed between an RF signal source 516, such as an RF mixer, an oscillator or the like, and an antenna 518 to which the amplified RF signal is fed. In some embodiments, for example, the input power level to the power amplifier 500 is preferably 0 dBm and the output power level is nominally about 28 dBm, and so power amplifier 500 has an overall gain on the order of about 25-30 dB although power amplifiers having gains above 30 dB or below 25 dB are also encompassed by the present invention. In some embodiments, the input amplifier stage 502 has "class A" amplifier characteristics and has a gain between 9 and 13 dB. In some embodiments, the second amplifier stage 512 may have a gain between 8 and 12 dB and the output amplifier stage 510 may have a gain between 2 and 10 dB and preferably between 4 and 8 dB. The signal received by the input amplifier stage 502 is an RF signal from the oscillator 516. The output signal produced by the third amplifier stage 510 is fed into the antenna 518. This configuration provides compensation for the AM-AM and AM-PM distortion of the output amplifier stage.

Figure 6:
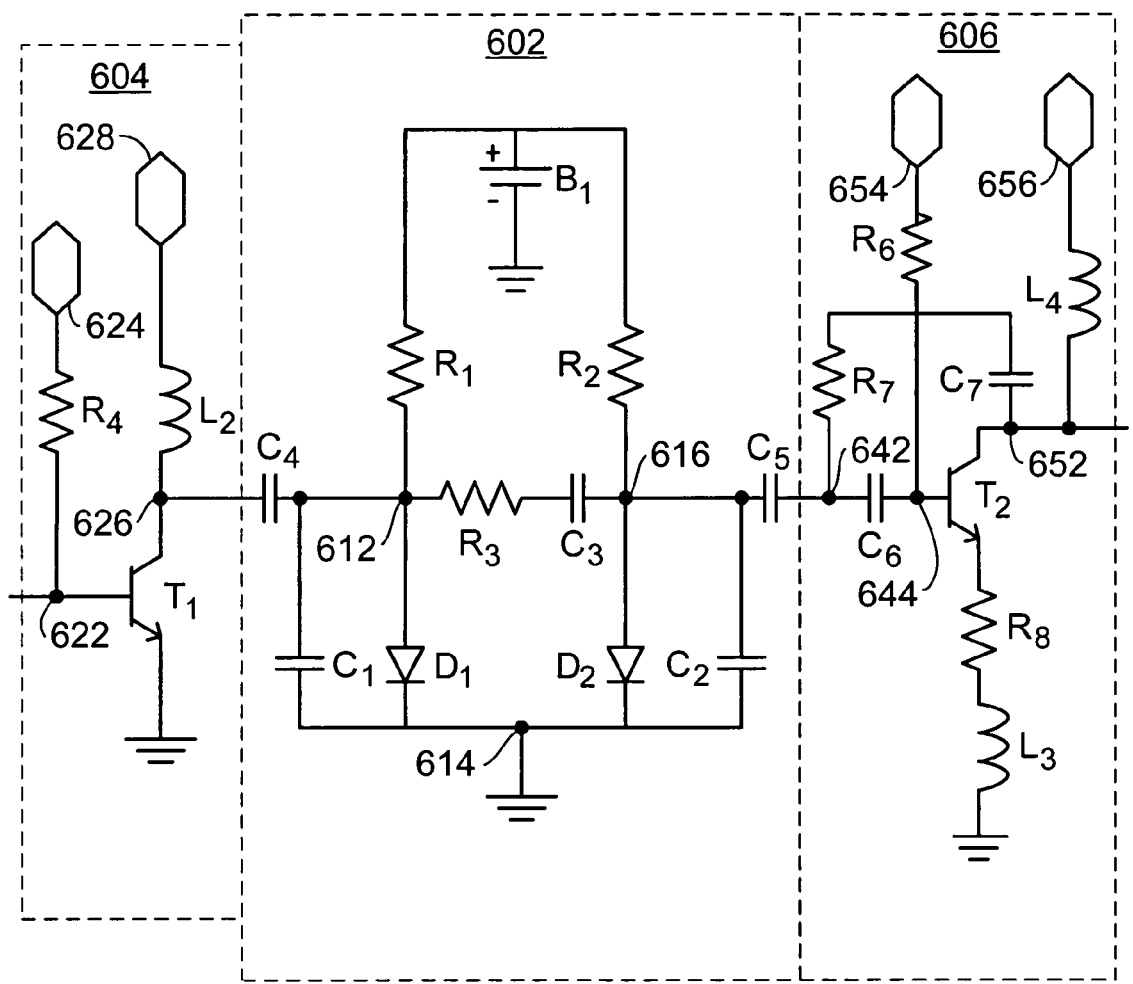
FIG. 6 shows a predistorter with shunt Schottky diodes in a preferred embodiment according to the present invention.

FIG. 6 is a diagram illustrating one embodiment of a predistorter in accordance with the present invention. In FIG. 6, predistorter 602 is between an input amplifier stage 604 and an output amplifier stage 606. Circuit 600 may be a two-stage power amplifier or part of a three-or-more stage power amplifier.

In the embodiment shown in FIG. 6, predistorter 602 receives a pre-amplified signal from output node 626 of the input amplifier stage 604 at node 612 through blocking capacitor C4. First shunt diode D1 is connected in parallel with first shunt capacitor C1 between node 612 and common node 614. First resistor R1 is connected in series between power source B1 and node 612 and is selected to provide DC bias to D1. Second shunt diode D2 is connected in parallel with second shunt capacitor C2. between node 616 and common node 614. Second resistor R2 is connected in series between power source B1 and node 616 and is selected to provide DC bias to D2. Between node 612 and node 616, third resistor R3 is connected in series to third capacitor C3. Resistor R3 is a lossy element that attenuates the input signal at node 612 such that D2 turns on at a higher input power level than D1. Capacitor C3 blocks the biasing currents for diodes D1 and D2. The values for R3 and C3 are selected to position the breakpoints shown in FIG. 4.

Shunt diodes D1 and D2 are biased such that at a predetermined input power level the diode enters its "expansion operating region" that predistorts the input signal to substantially compensate for the gain compression of the output stage. Similarly, shunt capacitors C1 and C2 act to predistort the phase of the input signal to compensate for the phase distortion of the output stage in gain compression.

Table 1 presents component values for the circuitry of FIG. 6 for one embodiment of the present invention. It should be kept in mind, however, that these values may be changed, depending on the exact shape and non-linear nature of the distortion curve.

TABLE 1

Component values for embodiment of FIG. 6.

| Component | Value |
|---|---|
| R1 | 200 Ω |
| R2 | 200 Ω |
| R3 | 2 Ω |
| C1 | 1.2 pF |
| C2 | 1.2 pF |
| C3 | 12 pF |
| C4 | 5 pF |
| C5 | 16 pF |
| L1 | 0.03 nH; 0.06 Ω |
| B1 | 0.7 V (DC) |

The input amplifier stage 604 as shown in FIG. 6 comprises a first transistor T1, a base bias resistor R4, and a second inductor L2 acting as an RF choke providing an AC load. Port 624 provides an electrical connection point to a base biasing network. Similarly, port 628 provides an electrical connection point to the collector biasing network. Fourth node 622 connects the base of T1 to the input RF signal and the base biasing current from the base biasing network. It should be understood that the input RF signal entering input amplifier stage 604 may be an un-amplified signal or an amplified signal taken from the output of a previous amplifier stage. The emitter of the first transistor T1 is preferably grounded. Node 626 connects the collector of T1 to the collector biasing network through port 628 and a blocking capacitor C4 that provides AC isolation between the input amplifier stage 604 and the predistorter 602.

The output amplifier stage 606 shown in FIG. 6 shows a second transistor T2 that provides amplification for the output stage 606. FIG. 6 shows two types of feedback circuits used to stabilize and control the gain of T2 and are illustrative of the types of feedback that may be provided to stabilize T2. Resistor R8 in series with inductor L3 between the T2 emitter and ground provide series feedback to T2. Similarly, resistor R7 in series with capacitor C7 between the T2 collector at node 652 and the output stage input node 642 provide parallel feedback to T2. Other types of feedback using active or passive elements may also be incorporated into the output amplifier stage 606. Seventh node 644 connects the base of T2 to sixth resistor R6 and sixth capacitor C6. Base biasing resistor R6 is connected to port 654. Port 654 provides an electrical connection point to the base biasing network for T2. Capacitor C6 connects node 642 to the base of T2 at node 644 and isolates the base biasing current and the parallel feedback loop. Eighth node 652 connects the collector of T2 to the parallel feedback circuit, the collector biasing network through port 656, and the output of the power amplifier 600. The fourth inductor L4 connected between the eighth node 652 and port 656 acts as an RF choke.

Figure 7:
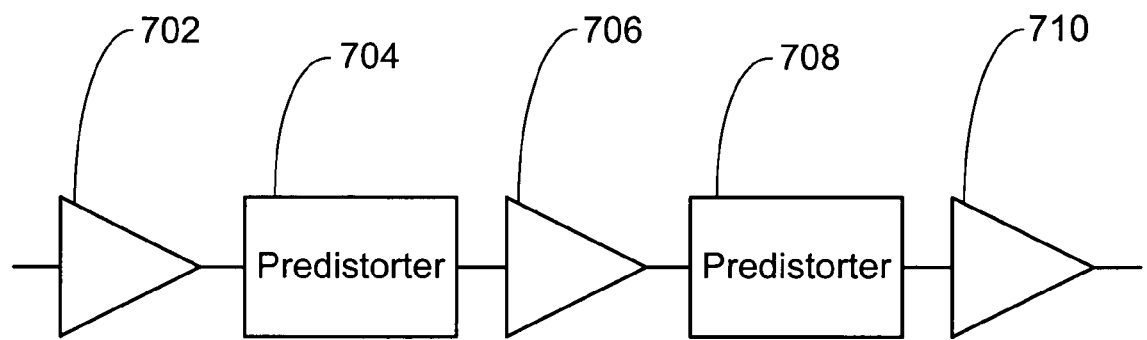
FIG. 7 shows a schematic of another power amplifier in a preferred embodiment according to the present invention.

FIG. 7 shows a block diagram of another embodiment in accordance with the present invention. The configuration shown in FIG. 7 is advantageous for implementing antiparallel Schottky diode predistorters or a combination of shunt-type predistorters with antiparallel diode predistorters. In the embodiment shown in FIG. 7, the power amplifier is a three stage amplifier. The power amplifier 700 comprises first amplifier stage 702, second amplifier stage 706, and third amplifier stage 710. It also comprises first predistorter 704 and second predistorter 708. First predistorter 704 is placed between first amplifier stage 702 and second amplifier stage 706. Second predistorter 708 is between second amplifier stage 706 and third amplifier stage 710.

Figure 8:
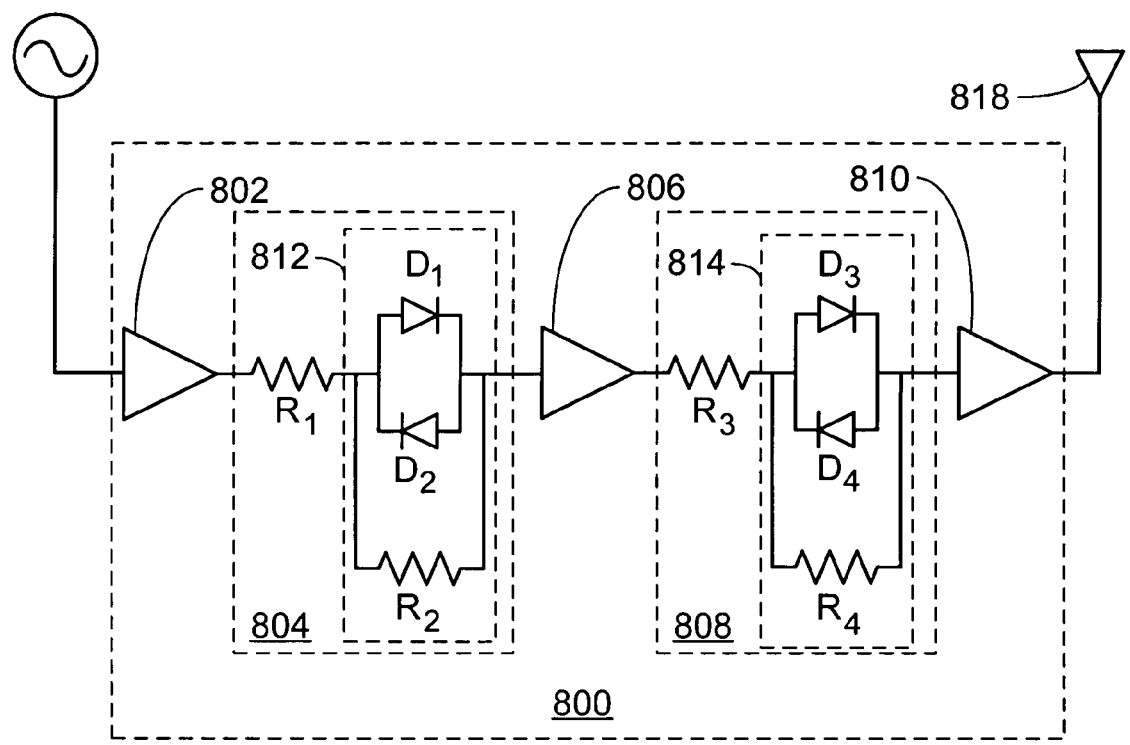
FIG. 8 shows a three-stage power amplifier with antiparallel Schottky diodes in a preferred embodiment according to the present invention.

FIG. 8 is a diagram illustrating the embodiment shown in FIG. 7 for a three-stage power amplifier 800 with a distributed predistorter having antiparallel diodes. As shown in FIG. 8, the power amplifier 800 comprises an input amplifier stage 802, a second amplifier stage 806, an output amplifier stage 810. First predistorter 804 is placed between the input amplifier stage 802 and the second amplifier stage 806. Second predistorter 808 is placed between the second amplifier stage 806 and the output amplifier stage 810.

The first predistorter 804 comprises a first resistor R1 connected in series with the output of the input amplifier stage and a first sub-circuit 812. The first sub-circuit 812 comprises a first pair of antiparallel diodes, D1 and D2, connected in parallel with a second resistor R2.

The second predistorter 808 similarly comprises a third resistor R3 connected in series with the output of the second amplifier stage and a second sub-circuit 814. The second sub-circuit 814 comprises a second pair of antiparallel diodes, D3 and D4, connected in parallel with the fourth resistor R4.

Diodes D1, D2, D3 and D4 may be Schottky diodes although other types of diodes may be used in the predistorter. The values for the first and third resistors, R1 and R3 are selected to control when the sub-circuits 812 and 814, respectively, begin distorting the input signal. The values for the second and fourth resistors, R2 and R4, are selected to control the phase distortion of the input signal when coupled to the depletion capacitance of the reversed biased diode.

Distributing the predistorters between the internal amplifier stages of the power amplifier provides for greater efficiency with respect to prior art configurations where predistorters are placed external to the power amplifier and before the input amplification stage of the power amplifier. In prior configurations, a designer must select a power amplifier with a larger gain to compensate for the 3-5 dB loss caused by each predistorter. The use of a power amplifier with a larger gain results in the power amplifier operating farther from saturation, which reduces efficiency. By placing the predistorters inside the power amplifier, the power loss caused by the predistorter may be compensated by the internal amplifier stage while keeping the power amplifier near saturation for higher efficiency.

Power amplifier 800 is preferably used in the same manner as power amplifier 500. Thus, power amplifier 800 is preferably used in a wireless or wired communication device, such as a cellular telephone. In such case, the preferred carrier frequency in such a wireless device is between about 800 MHz and 2 GHz, so that the device can accommodate GSM, DCS and other well-known wireless standards. It should be kept in mind, however, that other carrier frequencies may also, or instead, be accommodated. Power amplifier 800 may also be used in other handheld communication devices.

Figure 9:
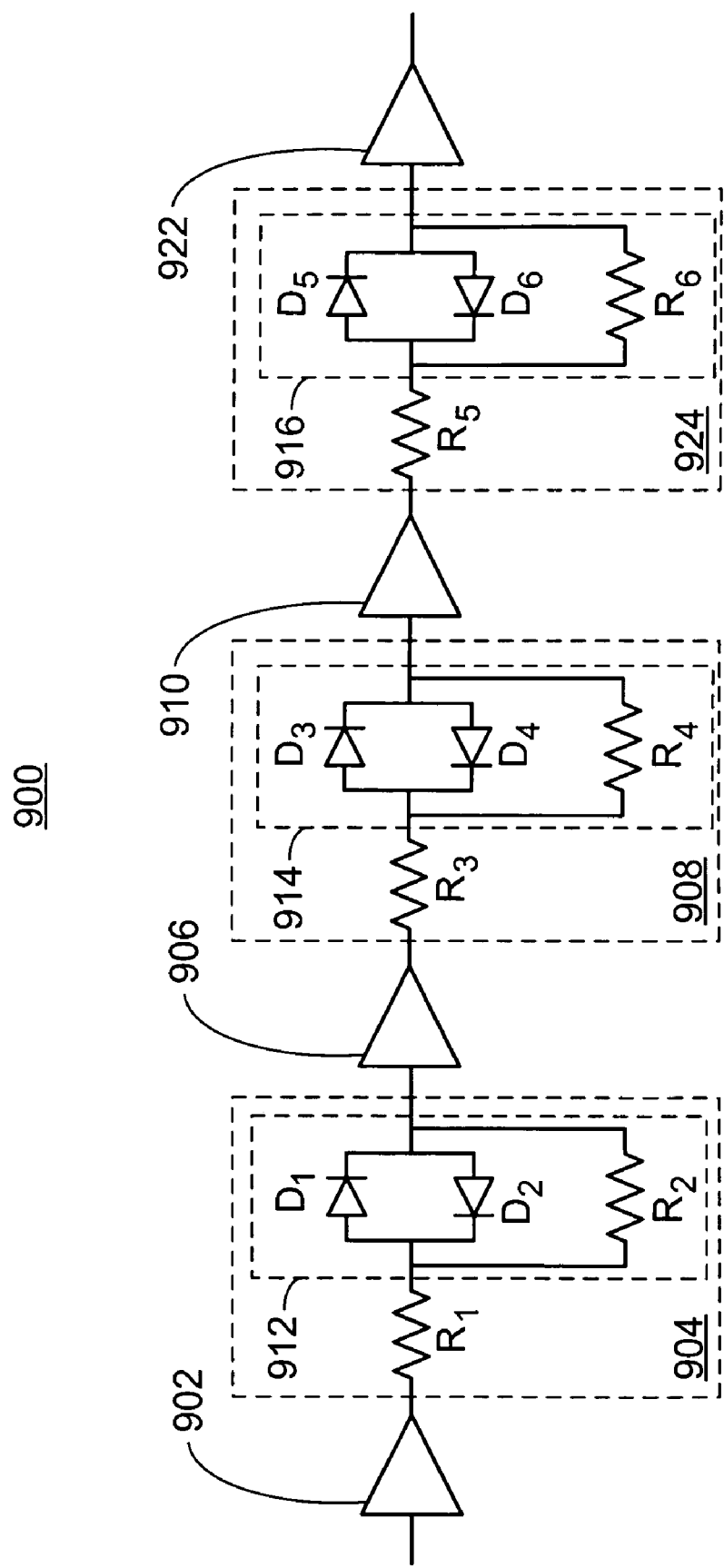
FIG. 9 shows a four-stage power amplifier with antiparallel Schottky diodes in a preferred embodiment according to the present invention.

It is understood that power amplifier 800 may be extended to comprise more than three amplifier stages. For example, FIG. 9 shows a four-stage power amplifier with three antiparallel Schottky diode predistorters corresponding to a predistortion function having three breakpoints. It is understood that more than four stages may likewise be used to improve the curve fitting.

Figure 10:
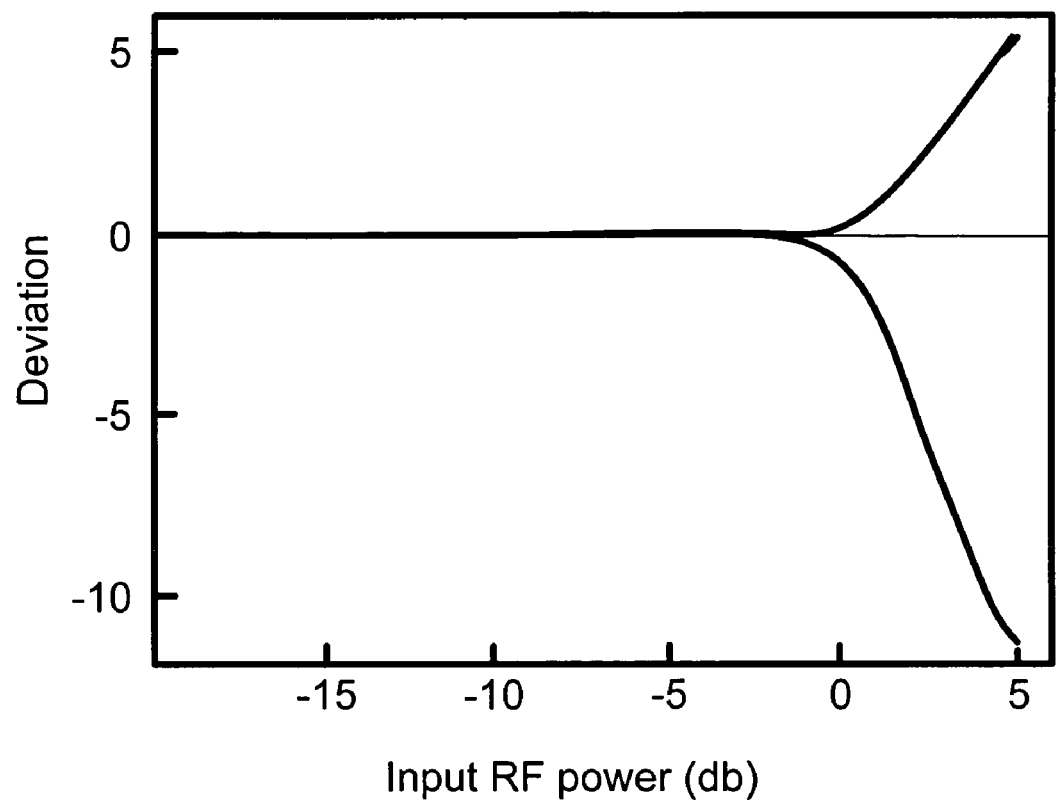
FIG. 10 shows the predistortion functions from a simulation of an embodiment using shunt-type predistorter in accordance with the present invention.

FIG. 10 shows gain 1002 and phase 1004 predistortion functions for a simulated shunt-type predistorter such as the one shown in FIG. 6. In FIG. 10, the gain and phase predistortion functions in the simulation have been normalized to the small signal performance. As shown in FIG. 10, the predistortion does not distort the input signal when the input RF power is below −2 dB. When the input RF power is over −2 dB, however, the curves deviate from the 0 dB axis to compensate for the large-signal distortion caused by the output amplifier stage. Simulations of a power amplifier incorporating a two-section predistorter such as the embodiment shown in FIG. 6 indicate phase deviation improvements of up to 5° and gain deviation improvements of up to 2 dB over power amplifiers without a predistorter are possible. Further improvements may be possible with three-or-more-section predistorters.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A power amplifier comprising:
   an input amplifier stage receiving a first input signal and producing a first output signal in response thereto;
   a predistorter receiving the first output signal and producing a predistorted signal in response thereto according to a predistortion function, the predistorter further comprising:
   a first diode and a first capacitor connected in parallel between a first node and a common node;
   a second diode and a second capacitor connected in parallel between a second node and the common node; and
   an attenuation circuit between the first node and the second node; and
   an output amplifier stage receiving the predistorted signal and producing a second output signal in response thereto according to an amplifier transfer function characterized by a linear region and a compression region,
   wherein the predistorted function compensates for the compression region of the amplifier transfer function.

2. The power amplifier of claim 1, wherein the predistorter comprises at least one diode arranged in a shunt configuration.

3. The power amplifier of claim 1, wherein the attenuation circuit comprises a third resistor in series with a third capacitor.

4. A power amplifier comprising:
   at least a first, a second and a third amplifier stages;

a first predistorter circuit between the first and second amplifier stages, and a second predistorter circuit between the second and third amplifier stages.

5. The power amplifier of claim 4 wherein the first predistorter circuit comprises a first resistor in series with a first subcircuit, the first subcircuit comprising a first pair of antiparallel diodes connected in parallel with a second resistor.

6. The power amplifier of claim 4 wherein the second predistorter circuit comprises a third resistor in series with a second subcircuit, the second subcircuit comprising a second pair of antiparallel diodes connected in parallel with a fourth resistor.

7. The power amplifier of claim 4, further comprising a fourth amplifier stage and a third predistorter circuit between the third and fourth amplifier stages.

8. The power amplifier of claim 7 wherein the third predistorter circuit comprises a fifth resistor in series with a third subcircuit, the third subcircuit comprising a third pair of antiparallel diodes connected in parallel with a sixth resistor.

9. A wireless communication device having a power amplifier therein, the power amplifier comprising:

a first amplifier stage receiving a first input signal and producing a first output signal in response thereto;

a predistorter receiving the first output signal and producing a predistorted signal in response thereto, the predistorter comprising:

a first diode and a first capacitor connected in parallel between a first node and a common node;

a second diode and a second capacitor connected in parallel between a second node and the common node; and an attenuation circuit between the first node and the second node; and a second amplifier stage receiving the predistorted signal and producing a second output signal in response thereto.

10. The wireless communication device of claim 9, wherein the wireless communication device is a cellular telephone.

11. The wireless communication device of claim 9, wherein the wireless communication device is a handheld communication device.

12. A wireless communication device having a power amplifier therein, the power amplifier comprising:

at least a first, a second and a third amplifier stages;

a first predistorter circuit between the first and second amplifier stages, and a second predistorter circuit between the second and third amplifier stages.

13. The wireless communication device of claim 12, wherein:

the first predistorter circuit comprises a first resistor in series with a first subcircuit, the first subcircuit comprising a first pair of antiparallel diodes connected in parallel with a second resistor; and the second predistorter circuit comprises a third resistor in series with a second subcircuit, the second subcircuit comprising a second pair of antiparallel diodes connected in parallel with a fourth resistor.

14. The wireless communication device of claim 13, wherein the wireless communication device is a cellular telephone.

15. The wireless communication device of claim 13, wherein the wireless communication device is a handheld communication device.

16. A power amplifier comprising:

an input amplifier stage receiving a first input signal and producing a first output stage in response thereto;

a predistorter receiving the first output signal and producing a predistorted signal in response thereto according to a predistortion function;

an output amplifier stage receiving the predistorted signal and producing a second output signal in response thereto according to an amplifier transfer function characterized by a linear region and a compression region;

a first interstage matching network for matching an output impedance of the input amplifier stage to an input impedance of the predistorter; and a second interstage matching network for matching an output impedance of the predistorter to an input impedance of the output amplifier.

* * * * *